(12) United States Patent
Liu et al.

(10) Patent No.: US 11,906,590 B2
(45) Date of Patent: Feb. 20, 2024

(54) METHOD AND DEVICE FOR DETECTING ABNORMALITY OF LITHIUM BATTERY, BATTERY MANAGEMENT SYSTEM, AND BATTERY SYSTEM

(71) Applicant: CONTEMPORARY AMPEREX TECHNOLOGY CO., LIMITED, Ningde (CN)

(72) Inventors: Zhi Liu, Ningde (CN); Dongyang Shi, Ningde (CN)

(73) Assignee: CONTEMPORARY AMPEREX TECHNOLOGY CO., LIMITED, Ningde (CN)

( * ) Notice: Subject to any disclaimer, the term of this patent is extended or adjusted under 35 U.S.C. 154(b) by 150 days.

(21) Appl. No.: 17/717,605

(22) Filed: Apr. 11, 2022

(65) Prior Publication Data

US 2022/0236333 A1    Jul. 28, 2022

Related U.S. Application Data

(63) Continuation of application No. PCT/CN2021/074249, filed on Jan. 28, 2021.

(51) Int. Cl.
*G01R 15/00* (2006.01)
*G01R 31/3835* (2019.01)
(Continued)

(52) U.S. Cl.
CPC ........ *G01R 31/3835* (2019.01); *B60L 3/0046* (2013.01); *B60L 50/60* (2019.02);
(Continued)

(58) Field of Classification Search
CPC ............... G01R 31/367; G01R 31/374; G01R 31/379; G01R 31/382; G01R 31/387;
(Continued)

(56) References Cited

U.S. PATENT DOCUMENTS 7,856,328 B2    12/2010  Barsoukov et al.
2009/0099802 A1  4/2009  Barsoukov et al.
(Continued)

FOREIGN PATENT DOCUMENTS

CN    103091636 A    5/2013
CN    109613436 A    4/2019
(Continued)

OTHER PUBLICATIONS

Communication pursuant to Article 94(3) EPC dated Dec. 15, 2022 received in European patent Application No. EP 21865345.9.
(Continued)

*Primary Examiner* — Thang X Le
(74) *Attorney, Agent, or Firm* — Scully, Scott, Murphy, Presser, P.C.

(57) ABSTRACT

Embodiments of this application provide a method and a device for detecting abnormality of a lithium battery, a battery management system, and a battery system. The method includes: obtaining a SOC value of the lithium battery in a charge process, where the SOC value is a ratio of a remaining capacity of the battery to a nominal capacity of the battery; changing a value of a charge current at a time point corresponding to an arbitrary SOC value, and obtaining a response signal within a time period of maintaining the changed charge current; and determining, based on response signals at time points corresponding to a plurality of SOC values, whether the lithium battery is abnormal. The method can implement non-destructive detection of abnormality of a lithium-ion battery, simplify operation, and achieve relatively high accuracy.

12 Claims, 14 Drawing Sheets

501  Obtaining a first voltage value in an $N^{th}$ voltage signal at a start time point of a first preset duration, and obtaining a second voltage value in the $N^{th}$ voltage signal at an end time point of the first preset duration 502  Obtaining an Nth voltage variation value based on a difference between the first voltage value and the second voltage value in the $N^{th}$ voltage signal 503  Determining, based on the voltage variation value, whether the lithium battery is abnormal

(51) Int. Cl.
    *H02J 7/00*     (2006.01)
    *H01M 10/48*     (2006.01)
    *H01M 10/42*     (2006.01)
    *B60L 3/00*     (2019.01)
    *B60L 58/12*     (2019.01)
    *B60L 53/62*     (2019.01)
    *B60L 50/60*     (2019.01)

(52) U.S. Cl.
    CPC ............... *B60L 53/62* (2019.02); *B60L 58/12* (2019.02); *H01M 10/425* (2013.01); *H01M 10/48* (2013.01); *H02J 7/0048* (2020.01); *H01M 2010/4271* (2013.01); *H01M 2220/20* (2013.01)

(58) Field of Classification Search
    CPC ............... G01R 31/389; G01R 31/392; G01R 31/3842; G01R 31/3606; G01R 31/3624; G01R 31/3634; G01R 31/3648; G01R 31/3651; G01R 31/3662; G01R 31/3665; G01R 31/3675; G01R 31/3679; G01R 31/3835
See application file for complete search history.

(56) References Cited

U.S. PATENT DOCUMENTS

| | | |
|---|---|---|
| 2012/0098489 A1 | 4/2012 | Arai et al. |
| 2013/0113426 A1 | 5/2013 | Arai et al. |
| 2016/0190831 A1* | 6/2016 | Mori ........................ B60L 53/00 320/162 |
| 2018/0183252 A1 | 6/2018 | Kim et al. |
| 2018/0196107 A1 | 7/2018 | Fleischer et al. |
| 2018/0321323 A1* | 11/2018 | Dubarry .............. G01R 31/3835 |
| 2022/0179008 A1* | 6/2022 | Lee ..................... G01R 31/3835 |
| 2023/0084079 A1* | 3/2023 | Kwak .................. G01R 31/392 324/432 |

FOREIGN PATENT DOCUMENTS

| | | |
|---|---|---|
| CN | 110383570 A | 10/2019 |
| CN | 111273180 A | 6/2020 |
| CN | 111638461 A | 9/2020 |
| CN | 111751741 A | 10/2020 |

OTHER PUBLICATIONS

Extended European Search Report dated Sep. 1, 2022 received in European patent Application No. EP 21865345.9.

\* cited by examiner

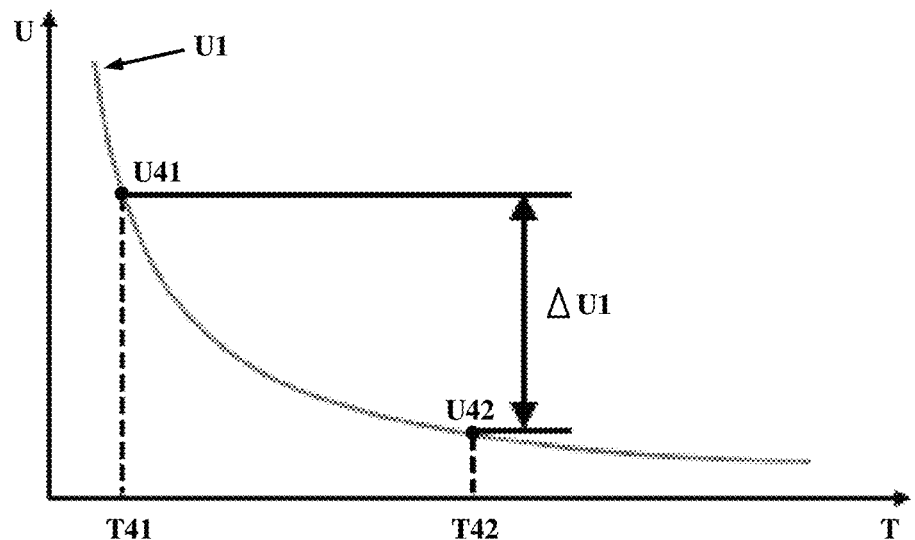

FIG. 4

```
┌─────────────────────────────────────────────────────────────┐
│ Obtaining a first voltage value in an Nᵗʰ voltage signal at a start time point │ ─ 501
│ of a first preset duration, and obtaining a second voltage value in the Nᵗʰ    │
│      voltage signal at an end time point of the first preset duration           │
└─────────────────────────────────────────────────────────────┘
                                    │
┌─────────────────────────────────────────────────────────────┐
│ Obtaining an Nth voltage variation value based on a difference between the │ ─ 502
│    first voltage value and the second voltage value in the Nᵗʰ voltage signal │
└─────────────────────────────────────────────────────────────┘
                                    │
┌─────────────────────────────────────────────────────────────┐
│ Determining, based on the voltage variation value, whether the lithium │ ─ 503
│                       battery is abnormal                               │
└─────────────────────────────────────────────────────────────┘
```

FIG. 5

| Serial number | Added pulse | ΔU varies with SOC | Abnormal as shown by a signal? | Abnormal as shown by disassembling? |
|---|---|---|---|---|
| 1 | Standing 8s | ΔU vs. SoC (0~8s) | Yes | Yes |
| 2 | 1.1C 8s | ΔU vs. SoC (0~8s) | Yes | Yes |
| 3 | 1.0C 8s | ΔU vs. SoC (0~8s) | Yes | Yes |

FIG. 18

| Serial number | Time range of a signal | ΔU varies with SOC | Abnormal as shown by a signal? | Abnormal as shown by disassembling? |
|---|---|---|---|---|
| 1 | 0~3s | ΔU vs. SoC (0~3s) | Yes | Yes |
| 2 | 0~8s | ΔU vs. SoC (0~8s) | Yes | Yes |
| 3 | 3~8s | ΔU vs. SoC (3~8s) | Yes | Yes |

FIG. 19

METHOD AND DEVICE FOR DETECTING ABNORMALITY OF LITHIUM BATTERY, BATTERY MANAGEMENT SYSTEM, AND BATTERY SYSTEM

CROSS-REFERENCE TO RELATED APPLICATIONS

This application is a continuation of International Application No. PCT/CN2021/074249, filed on Jan. 28, 2021, the disclosure of which is hereby incorporated by reference in its entirety.

TECHNICAL FIELD

This application relates to the technical field of batteries, and in particular, to a method and device for detecting abnormality of a lithium battery, a battery management system, and a battery system.

BACKGROUND

With the advancement of technology, lithium-ion batteries are widely used in the fields of consumer electronics, energy storage, and electric vehicles by virtue of significant advantages such as a high energy density, a long cycle life, and environment-friendliness. In performance evaluation of a lithium-ion battery, an indispensable technical indicator is a cycle life, including the cycle life under various temperatures and even some extreme application environments. In a cycle test, essential life evaluation indicators in addition to a capacity retention rate of the battery include: whether abnormality occurs during a cycle, and when the abnormality occurs. It is well known that, once the battery is abnormal, the abnormality may not only accelerate performance degradation, but also lead to a short circuit in the battery and result in a safety hazard.

Currently, a most commonly used method for determining whether the lithium-ion battery is abnormal is to charge the battery at different C-rates and temperatures, then disassemble the battery, visually check for abnormality, and subjectively identify an abnormal state and severity. However, this method mainly relies on empirical judgment of personnel, involves errors caused by subjective judgment, and is complicated to operate and inefficient. In addition, the lithium-ion battery, especially a power battery, is relatively large in size and weight. Some batteries are even steel-shell batteries, and disassembling the batteries brings some safety hazards and requires a relatively large number of labor resources and physical resources.

SUMMARY

An objective of this application is to provide a method and a device for detecting abnormality of a lithium battery, a battery management system, and a battery system to implement non-destructive detection of abnormality of a lithium-ion battery, simplify operation, and achieve relatively high accuracy.

To achieve the foregoing objective, according to a first aspect, this application provides a method for detecting abnormality of a lithium battery, including: obtaining a SOC value of the lithium battery in a charge process, where the SOC value is a ratio of a remaining capacity of the battery to a nominal capacity of the battery; changing a value of a charge current at a time point corresponding to an arbitrary SOC value, and obtaining a response signal within a time period of maintaining the changed charge current; and determining, based on response signals at time points corresponding to a plurality of SOC values, whether the lithium battery is abnormal.

In an optional implementation, the changing a value of a charge current at a time point corresponding to an arbitrary SOC value includes: outputting a change-current instruction at the time point corresponding to the arbitrary SOC value, so as to change the value of the charge current, where the change-current instruction includes an instruction to change the value of the charge current and an instruction indicating the time period of maintaining the changed charge current.

In an optional implementation, the changing a value of a charge current at a time point corresponding to an arbitrary SOC value includes: changing the value of the charge current at time points corresponding to at least three SOC values.

In an optional implementation, the response signal is a voltage signal.

In an optional implementation, the determining, based on response signals at time points corresponding to a plurality of SOC values, whether the lithium battery is abnormal includes: obtaining a first voltage value in an $N^{th}$ voltage signal at a start time point of a first preset duration, and obtaining a second voltage value in the $N^{th}$ voltage signal at an end time point of the first preset duration, where the first preset duration is an arbitrary time period within the time period of maintaining the charge current changed each time; obtaining an $N^{th}$ voltage variation value based on an absolute value of a difference between the first voltage value and the second voltage value in the $N^{th}$ voltage signal; and determining, based on the voltage variation value, whether the lithium battery is abnormal.

In an optional implementation, the determining, based on the voltage variation value, whether the lithium battery is abnormal includes: obtaining an $N^{th}$ data point based on the $N^{th}$ voltage variation value and a corresponding SOC value; and determining, based on the data point, whether the lithium battery is abnormal.

In an optional implementation, the determining, based on the voltage variation value, whether the lithium battery is abnormal includes: obtaining a first current value of the charge current at an arbitrary time point prior to each time of changing the charge current; calculating a ratio of the $N^{th}$ voltage variation value to the first current value, and recording the ratio as an $N^{th}$ first resistance variation value; obtaining an $N^{th}$ data point based on the $N^{th}$ first resistance variation value and a corresponding SOC value; and determining, based on the data point, whether the lithium battery is abnormal.

In an optional implementation, the determining, based on the voltage variation value, whether the lithium battery is abnormal includes: obtaining a second current value of the charge current at an arbitrary time point within the time period of maintaining the charge current changed each time; calculating a ratio of the $N^{th}$ voltage variation value to the second current value, and recording the ratio as an $N^{th}$ second resistance variation value; obtaining an $N^{th}$ data point based on the $N^{th}$ second resistance variation value and a corresponding SOC value; and determining, based on the data point, whether the lithium battery is abnormal.

In an optional implementation, the determining, based on the voltage variation value, whether the lithium battery is abnormal includes: obtaining a third current value of the charge current at an arbitrary time point prior to each time of changing the charge current, and a fourth current value of the charge current at an arbitrary time point within the time period of maintaining the charge current changed each time; calculating an absolute value of a difference between the third current value and the fourth current value; calculating a ratio of the $N^{th}$ voltage variation value to the absolute value, and recording the ratio as an $N^{th}$ third resistance variation value; obtaining an $N^{th}$ data point based on the $N^{th}$ third resistance variation value and a corresponding SOC value; and determining, based on the data point, whether the lithium battery is abnormal.

In an optional implementation, the determining, based on the data point, whether the lithium battery is abnormal includes: obtaining an $N^{th}$ slope between an $(N+1)^{th}$ data point and the $N^{th}$ data point, and an $(N+1)^{th}$ slope between an $(N+2)^{th}$ data point and the $(N+1)^{th}$ data point; and determining, if the $N^{th}$ slope is greater than 0 and the $(N+1)^{th}$ slope is less than 0, that the lithium battery is abnormal.

According to a second aspect, this application further provides a device for detecting abnormality of a lithium battery, including: a first obtaining unit, configured to obtain a SOC value of the lithium battery in a charge process, where the SOC value is a ratio of a remaining capacity of the battery to a nominal capacity of the battery; a second obtaining unit, configured to change a value of a charge current at a time point corresponding to an arbitrary SOC value, and obtain a response signal within a time period of maintaining the changed charge current; and a determining unit, configured to determine, based on response signals at time points corresponding to a plurality of SOC values, whether the lithium battery is abnormal.

According to a third aspect, this application further provides a device for detecting abnormality of a lithium battery, including: a memory; and a processor coupled to the memory, where the processor is configured to perform the foregoing method based on an instruction stored in the memory.

According to a fourth aspect, this application further provides a battery management system, including the foregoing device for detecting abnormality of a lithium battery.

According to a fifth aspect, this application further provides a battery system, including a rechargeable battery and the foregoing battery management system.

According to a sixth aspect, this application further provides an electric vehicle, including a charging and discharging device and the foregoing battery system.

According to a seventh aspect, this application further provides a computer-readable storage medium, storing a computer-executable instruction. The computer-executable instruction is set to be the foregoing method process.

Beneficial effects of the embodiments of this application are: the method for detecting abnormality of a lithium battery according to this application includes: first, obtaining a SOC value of the lithium battery in a charge process, where the SOC value is a ratio of a remaining capacity of the battery to a nominal capacity of the battery; then, changing a value of a charge current at a time point corresponding to an arbitrary SOC value, and obtaining a response signal within a time period of maintaining the changed charge current; and finally, determining, based on response signals at time points corresponding to a plurality of SOC values, whether the lithium battery is abnormal. This application can perform detection without disassembling the battery, and implement a non-destructive detection method. Just the value of the charge current needs to be changed in the charge process, thereby simplifying operation. In addition, whether the battery is abnormal is determined based on an automatically generated response signal, thereby avoiding errors caused by subjective judgment, and achieving relatively high accuracy.

BRIEF DESCRIPTION OF DRAWINGS

To describe the technical solutions in the embodiments of this application more clearly, the following outlines the drawings used in the embodiments of this application. Apparently, the drawings outlined below are merely a part of embodiments of this application. A person of ordinary skill in the art may derive other drawings from the outlined drawings without making any creative efforts.

FIG. 4 is a schematic diagram of response signals according to an embodiment of this application;

FIG. 5 is a schematic diagram of a method for determining abnormality of a lithium battery based on at least three response signals according to an embodiment of this application;

FIG. 18 is a schematic diagram of determining abnormality of a lithium battery by changing a charge current to different values according to an embodiment of this application;

FIG. 19 is a schematic diagram of determining abnormality of a lithium battery based on different first preset durations according to an embodiment of this application;

Figure 1:
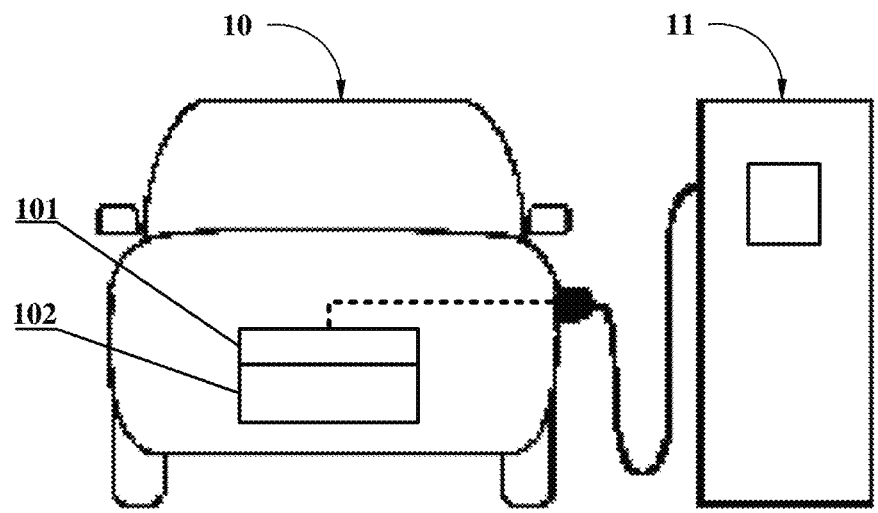
FIG. 1 is a schematic diagram of an application scenario according to an embodiment of this application.

The drawings are not drawn to scale.

DETAILED DESCRIPTION OF EMBODIMENTS

The following gives a more detailed description of implementations of this application with reference to accompanying drawings and embodiments. The detailed description of the following embodiments and the accompanying drawings are intended to exemplarily describe the principles of this application, but not to limit the scope of this application. Therefore, this application is not limited to the described embodiments.

In the description of this application, unless otherwise specified, "a plurality of" means two or more; the terms such as "upper", "lower", "left", "right", "inner", and "outer" indicating a direction or a position relationship are merely intended for ease or brevity of description of this application, but do not indicate or imply that the device or component referred to must be located in the specified direction or constructed or operated in the specified direction. Therefore, such terms shall not be understood as a limitation on this application. In addition, the terms "first", "second", and "third" are merely intended for descriptive purposes, but are not intended to indicate or imply relative importance. "Perpendicular" is not exactly perpendicular, but within an error tolerance range. "Parallel" is not exactly parallel, but within an error tolerance range.

The directional terms appearing in the following description indicate the directions shown in the drawings, but are not intended to limit specific structures in this application. In the context of this application, unless otherwise expressly specified, the terms "mount", "concatenate", and "connect" are understood in a broad sense. For example, a "connection" may be a fixed connection, a detachable connection, or an integrated connection, and may be a direct connection or an indirect connection implemented through an intermediary. A person of ordinary skill in the art can understand the specific meanings of the terms in this application according to specific situations.

An embodiment of this application provides a method for detecting abnormality of a lithium battery. The method can determine abnormality of the lithium battery by merely using a single charge process of the lithium battery. Compared with the prior art, this application can directly determine, in real time in the charge process of the lithium battery, whether the battery is abnormal, without limiting a charging mode of the lithium battery. For example, the method is applicable to both constant-current charging and variable-current charging.

It needs to be noted that the abnormality in this application primarily means a type of performance abnormality of a battery in use, and the performance abnormality is caused by lithium plating inside the lithium battery.

During charging of a normal lithium battery, lithium ions are deintercalated from an active material of a positive electrode, and intercalated into sheets of an active material of a negative electrode (using graphite as an example). Lithium plating of the lithium battery means: after being deintercalated, the lithium ions are obstructed and unable to be intercalated into the sheets of the active material of the negative electrode, and therefore, are deposited and grown on a surface of the negative electrode.

Consequently, after lithium plating occurs in the lithium battery, the following abnormal circumstances may occur in the lithium battery.

First, a self-discharge rate of the lithium battery that undergoes lithium plating increases. Therefore, in practical applications, for example, in an electric vehicle, the lithium battery usually exists in the form of a battery pack. The abnormality increases a voltage difference between the lithium battery undergoing lithium plating and other batteries. A plurality of parallel- or serial-connected lithium batteries are generally disposed in the battery pack. That is because, when a normal lithium battery is not in use, the voltage of the battery drops continuously and slowly. The lithium plating of the lithium battery leads to a micro short circuit inside the battery, aggravates the voltage drop of the battery, and therefore, leads to voltage inconsistency between the lithium battery undergoing lithium plating and other lithium batteries in the battery pack.

Second, attenuation of a capacity of the lithium battery undergoing lithium plating accelerates, and a service life decreases. That is because, on the one hand, a lithium plating process consumes active lithium ions inside the battery, decreases a total content of available lithium ions in the lithium battery, and causes a loss of the capacity of the battery. On the other hand, precipitated lithium ions form an inert layer between the negative electrode and a separator to hinder transmission of lithium ions. This aggravates polarization in a charge and discharge process, and also causes a loss of the capacity of the battery.

Third, a thermal runaway phenomenon occurs in the lithium battery undergoing lithium plating, and leads to a fire and explosion. That is because precipitated lithium dendrites keep accumulating, and eventually pierce the separator to form a short circuit in a large area. Consequently, a temperature at a short-circuit point rises sharply, causes thermal runaway in the lithium battery, and leads to a fire and explosion.

In conclusion, by detecting whether the lithium battery has undergone lithium plating, the method for detecting abnormality of a lithium battery according to this application can detect whether the foregoing abnormality occurs in the lithium battery.

For ease of understanding this application, the following describes application scenarios of this application first. Refer to FIG. 1. FIG. 1 shows an application scenario of a method for detecting abnormality of a lithium battery according to this application. This scenario includes an electric vehicle 10 and a charging pile 11. As shown in FIG.

1, a BMS 101 (BMS is an acronym of battery management system) and a lithium battery 102 are disposed in the electric vehicle 10. The BMS 101 is a set of control systems for protecting operation safety of the lithium battery 102 and always monitors operation status of the lithium battery 102. The charging post 11 is configured to charge the lithium battery 102. The charge process needs to be controlled by the BMS 101. Therefore, in the charge process, the BMS 101 can control a charging mode in which the charging pile 11 charges the lithium battery 102, such as a constant-current charging mode or a variable-current charging mode. In addition, the BMS 101 can control a value of a charge current at which the charging pile 11 charges the lithium battery 102, and read parameter changes of the lithium battery 102, so as to determine in real time whether the lithium battery 102 is abnormal. The foregoing method can detect, in a non-destructive manner in the charge process, whether the lithium battery 102 is abnormal in the charge process, so that corresponding countermeasures can be taken in time to avoid accidents caused by the abnormality of the lithium battery 102, for example, to avoid a major safety accident such as an explosion of the lithium battery 102 caused by the abnormality such as a short circuit of the rechargeable battery.

Figure 2:
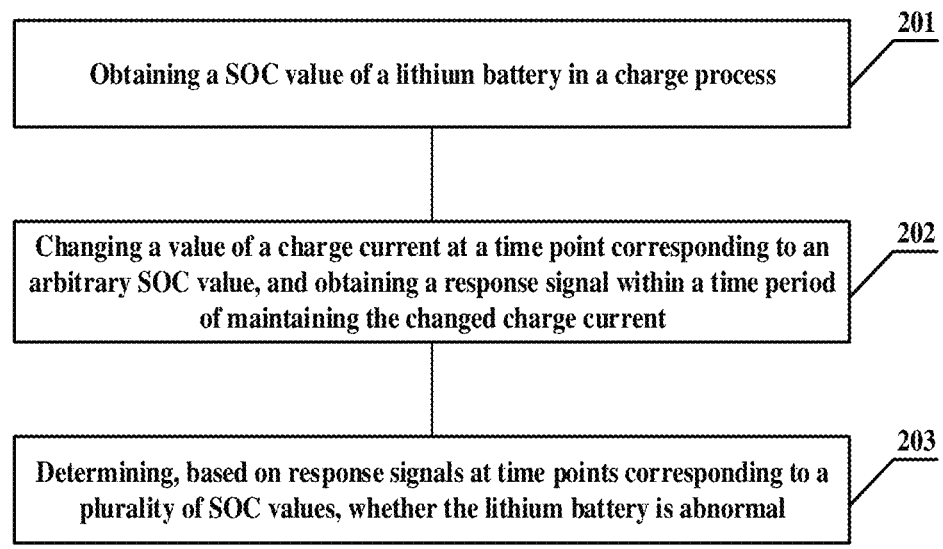
FIG. 2 is a schematic flowchart of a method for detecting abnormality of a lithium battery according to an embodiment of this application.

FIG. 2 is a schematic flowchart of a method for detecting abnormality of a lithium battery according to an embodiment of this application. As shown in FIG. 2, the method includes the following steps.

201: Obtaining a SOC value of a lithium battery in a charge process.

The charge process may include a constant-current charge process or a variable-current charge process. The constant-current charge process primarily means that a charge current keeps constant in the charge process. For example, the lithium battery keeps being charged at a charge rate of 1 C. The charge rate of 1 C means a charge rate at which the lithium battery can be charged to a full capacity from zero within 1 hour.

The variable-current charge process generally means a stepwise constant-current charge process (step charge), in which a variable-current charge process is divided into a plurality of constant-current charge sub-processes, and the charge rate varies between the constant-current charge sub-processes (each constant-current charge sub-process represents a phase of the constant-current charge process). For example, a variable-current charge process is divided into three phases. The charge rate at a first phase is 2 C, the charge rate at a second phase is 1.8 C, and the charge rate at a third phase is 1.5 C.

The SOC value means a ratio of a remaining capacity of the battery to a nominal capacity of the battery. The SOC value keeps changing in the charge process of the battery. The SOC value obtained in real time in the charge process may be used to determine a specific charge value that is available when the lithium battery is abnormal.

202: Changing a value of the charge current at a time point corresponding to an arbitrary SOC value, and obtaining a response signal within a time period of maintaining the changed charge current.

Understandably, no matter whether the process is a constant-current charge process or a variable-current charge process, changing the charge current at a time point corresponding to an arbitrary SOC value may be regarded as changing the charge current in a phase of the constant-current charge process. The phase of constant-current charge process may be a phase of constant-current charge process in a constant-current charge process, or a phase of constant-current charge process in a variable-current charge process (that is, a constant-current charge sub-process).

Changing the current in a phase of constant-current charge process is equivalent to imposing a disturbance on a steady electrochemical process in the lithium battery. This disturbance generates a variety of response signals (similar to throwing a stone onto a calm water surface). Subsequently, the most sensitive response signal may be selected from a variety of response signals to distinguish between a lithium battery undergoing lithium plating and a normal battery. The most sensitive response signal is generally a response signal that has changed most significantly.

In addition, because a current disturbance can be responded to quickly and is easy to control, this application changes the charge current to obtain a response signal.

In an embodiment, a change-current instruction is output at a time point corresponding to an arbitrary SOC value, so as to change the value of the charge current. The instruction includes an instruction to change the value of the charge current and an instruction indicating a time period of maintaining the changed charge current.

For example, when the method is applied to an electric vehicle and a charging pile shown in FIG. 1. If an original charge current is I1, a BMS of the electric vehicle outputs a change-charge-current instruction to the charging pile at the time point corresponding to the arbitrary SOC value. Based on the instruction, the charging pile changes the value (for example, I2) of the charge current that is output to the lithium battery in the electric vehicle, and maintains the changed charge current for the indicated time period, thereby achieving a purpose of changing the charge current. After expiry of the time period of maintaining the changed charge current, the charging pile restores the charge current prior to changing the charge current. That is, within the time period, the charging pile maintains the current at I2; and after expiry of the time period, the charging pile restores the current to I1 from I2.

In another example, it is assumed that the method is applied to, in a production process of the lithium battery, testing whether the lithium battery is abnormal. The charge current of the lithium battery is provided by a charger & discharger. In this case, a control unit in the charger & discharger outputs a change-current instruction. The instruction is executed by an execution unit of the charger & discharger, so as to achieve the purpose of changing the charge current.

Understandably, although the charge current is changed at the time point corresponding to an arbitrary SOC value, the charge current changed each time is maintained for a time period. In addition, a corresponding response signal is generated just within the time period of maintaining the changed charge current.

Figure 3A:
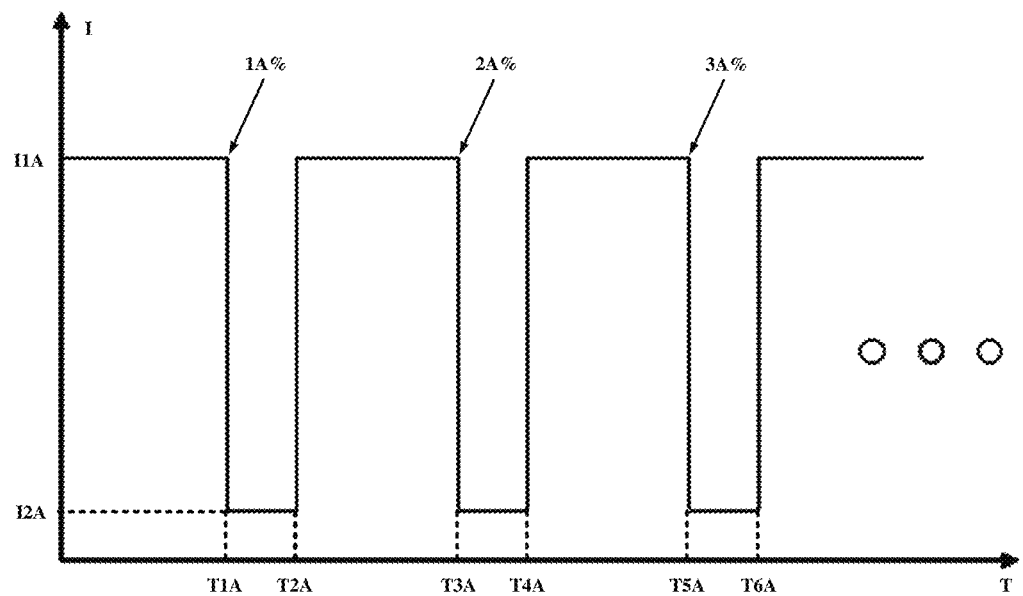
FIG. 3a is a schematic diagram of changing a value of a charge current at a time point corresponding to an arbitrary SOC value according to an embodiment of this application.

As shown in FIG. 3a, a constant-current charging mode is used as an example. A constant-current charge current of the lithium battery is I1A. The value of the charge current is changed to I2A at time points T1A, T3A, and T5A corresponding to the SOC values 1A %, 2A %, and 3A % respectively. The time period of maintaining the charge current changed each time is from the time point T1A to the time point T2A, abbreviated as (T1A, T2A); from the time point T3A to the time point T4A, abbreviated as (T3A, T4A); and, from the time point T5A to the time point T6A, abbreviated as (T5A, T6A), respectively. The three time periods may be set depending on actual working conditions, and may be the same or different. This is not limited herein. For example, the three time periods (T1A, T2A), (T3A, T4A), and (T5A, T6A) are set to 20 seconds uniformly, or set to 10 seconds, 20 seconds, and 30 seconds, respectively.

As can be learned from the above description, when the SOC value is 1A %, the charge current is changed to I2A at the corresponding time point T1A, and the time period of maintaining the changed charge current is (T1A, T2A). A response signal can be obtained within the time period. Therefore, the response signal is the response signal generated when the SOC value is 1A %. Based on the same reason, a response signal generated when the SOC value is 2A % and a response signal generated when the SOC value is 3A % can be obtained respectively. Understandably, the charge current I2A is less than the charge current I1A. This means that as shown in FIG. 3a, an operation performed at a time point corresponding to an arbitrary SOC is to reduce the charge current.

Figure 3B:
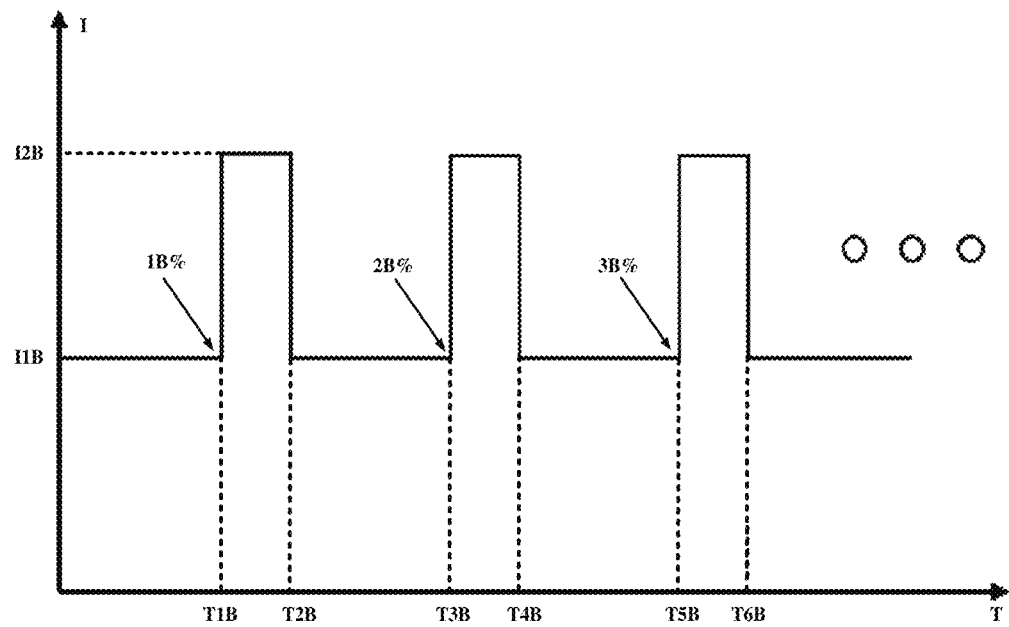
FIG. 3b is a schematic diagram of changing a value of a charge current at a time point corresponding to an arbitrary SOC value according to another embodiment of this application.

In other embodiments, the operation may be to increase the charge current or directly change the charge current to 0. As shown in FIG. 3b, the charge current is increased from I1B to I2B at the time points T1B, T3B, and T5B corresponding to the SOC values 1B %, 2B %, and 3B %, respectively. The implementation process is similar to the process of reducing the charge current, details of which are easily understandable to a person skilled in the art and are omitted here.

203: Determining, based on response signals at time points corresponding to a plurality of SOC values, whether the lithium battery is abnormal.

Currently, signals that can be collected by a battery management system include a voltage signal, a current signal, a capacity signal, and a temperature signal of the battery.

The capacity signal and the temperature signal are sampled at a relatively low precision, and suffers a hysteresis to some extent. The change of such signals, which is caused by a small amount of lithium plating, is hardly distinguishable. Therefore, the capacity signal and the temperature signal are not suitable as a response signal. In addition, in this application, the charge current is changed to obtain the response signal. This also means that the current signal is not suitable as a response signal. Therefore, in this application, the voltage signal characterized by higher precision and quicker response is selected as the response signal. Alternatively, a resistance signal obtained from a voltage signal may be selected as the response signal.

In conclusion, the response signal is a voltage signal or a resistance signal. Referring to FIG. 4, FIG. 4 is a schematic diagram of a possible response signal (in this case, a voltage signal). As shown in FIG. 4, the voltage changes with time to form a curve U1. The curve U1 represents the voltage signal. The voltage signal is just the response signal within a time period of maintaining the charge current changed for one time.

Specifically, a sampling interval may be set in advance. Voltage values are collected continuously at intervals of the sampling intervals within the time period of maintaining the charge current changed each time. The collected voltage values constitute voltage signals.

If the response signal is a resistance signal, the resistance signal may be obtained in diverse ways. If the charge process is a constant-current charge process, referring to FIG. 3a, assuming that the resistance signal is a response signal generated between the time point T1A and the time point T2A, the resistance signal is obtained in the following way: (1) obtaining a charge current applied before the SOC value is 1A %, and recording the charge current as $I_{old}$, and calculating a ratio of each voltage value in the curve U1 to $I_{old}$ to obtain resistance signals; (2) obtaining a charge current within the time period of (T1A, T2A), recording the charge current as $I_{new}$, and calculating a ratio of each voltage value in the curve U1 to $I_{new}$ to obtain resistance signals; and (3) obtaining a difference between $I_{new}$ and $I_{old}$, recording the difference as $I_{new1}$, and calculating a ratio of each voltage value in the curve U1 to $I_{new1}$ to obtain resistance signals.

If the charge process is a variable-current charge process, as can be learned from the foregoing description, when the charge current is changed in a specific constant-current charge sub-process of the variable-current charge process, the charge current in the constant-current charge sub-process is used as Iola, and $I_{new}$ and $I_{new1}$ are obtained in a way similar to the case of the constant-current charging. Subsequently, whether the lithium battery is abnormal can be determined based on a plurality of voltage signals or a plurality of resistance signals.

In an embodiment, the value of the charge current is changed at time points corresponding to at least three SOC values to obtain at least three response signals. Whether the lithium battery is abnormal is determined according to the at least three response signals. The specific determining method is described by using an example in which the response signals are voltage signals. As shown in FIG. 5, the method includes the following steps.

501: Obtaining a first voltage value in an $N^{th}$ voltage signal at a start time point of a first preset duration, and obtaining a second voltage value in the $N^{th}$ voltage signal at an end time point of the first preset duration.

502: Obtaining an $N^{th}$ voltage variation value based on an absolute value of a difference between the first voltage value and the second voltage value in the $N^{th}$ voltage signal.

The first preset duration is an arbitrary time period within the time period of maintaining the charge current changed each time, as described below with reference to the content shown in FIG. 3a and FIG. 4. As shown in FIG. 3a, at time points corresponding to at least three SOC values 1A %, 2A %, 3A %, and so on, respectively, the value of the charge current is changed to I2A. The corresponding voltage signals are obtained in the time periods (T1A, T2A), (T3A, T4A), and (T5A, T6A), respectively. Therefore, at least three voltage signals are obtained in total. Assuming that the voltage signals obtained in the time period (T1A, T2A) are the voltage signal U1 shown in FIG. 4, the voltage signal U1 in this case is the first voltage signal (N is 1). Therefore, in an arbitrary time period in the time period (T1A, T2A), such as a time period of (T41, T42), is used as a first preset duration, where (T41, T42) falls within (T1A, T2A). That is, T41≥T1A and T42≤T2A. T41 is a start time point of the first preset duration, and T42 is an end time point of the first preset duration. A first voltage value U41 of the voltage signal U1 is obtained, and a second voltage value U42 is obtained. An absolute value of a difference between the first voltage value U41 and the second voltage value U42 is calculated: $\Delta U1 = |U41 - U42|$ (the absolute value of the difference between U41 and U42). The difference $\Delta U1$ may be regarded as a first voltage variation value. Similarly, a second voltage variation value can be obtained from (T3A, T4A), and a third voltage variation value can be obtained from (T5A, T6A), and so on. If the charge current is changed N times in total, a total of N voltage variation values are obtained.

Figure 6:
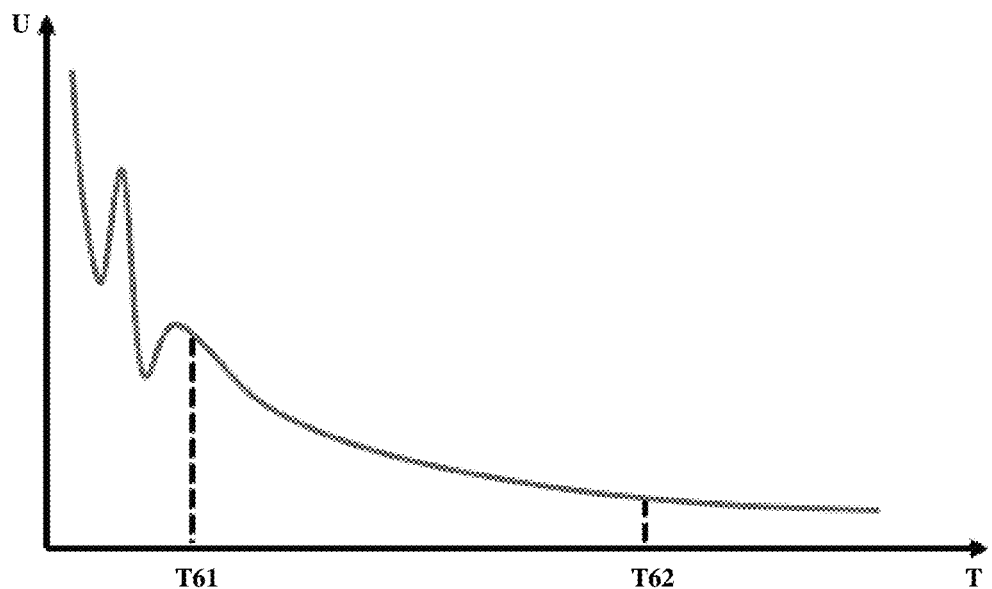
FIG. 6 is a schematic diagram of a response signal according to another embodiment of this application.

The first preset duration may be selected depending on actual working conditions, and is generally set to be between 0.1 s and 100 s. This is not limited herein. In an optional implementation solution, a time period corresponding to a lowest-noise part of the response signal may be selected as the first preset duration depending on the battery type and the sampling method. To be specific, before a test, a time range in which test signals are relatively steady is determined first based on parameters of a device configured to change the value of the charge current, so as to avoid noise signals. Then a voltage variation value is obtained from voltage signals of higher precision, so that the final determining result is more accurate. For example, as shown in FIG. 6, before the time point T61, a noise signal may be generated due to instability of the current. Therefore, the first preset duration may be set in advance to be subsequent to the time point T61, so as to avoid the noise signal.

Understandably, in a process of changing the charge current for a plurality of times, the charge current may be changed at equal intervals or unequal intervals of the SOC value. For example, in an embodiment, in a charge process, the value of the charge current is changed in equal increments of 5% SOC. For example, increments of the SOC value within both the time period (T2A, T3A) and the time period (T4A, T5A) in FIG. 3a are set to 5%. By contrast, in another embodiment, an increment of the SOC value within the time period (T2A, T3A) may be set to 5%, and an increment of the SOC value within the time period (T4A, T5A) may be set to 10%.

Similarly, the time period of maintaining the charge current changed each time may be the same or different. Still using FIG. 3a as an example, lengths of the three time periods (T1A, T2A), (T3A, T4A), and (T5A, T6A) may be the same or different. However, it needs to be noted that the first preset duration in each time period needs to be the same. Using FIG. 3a and FIG. 4 as an example, assuming that the first preset duration extracted from the time period (T1A, T2A) is a length of (T41, T42), the corresponding first voltage value, second voltage value, and voltage variation value need to be obtained in the same first preset duration in the time periods (T3A, T4A) and (T5A, T6A).

For example, assuming that the lengths of the three time periods (T1A, T2A), (T3A, T4A), and (T5A, T6A) are 10 seconds, 12 seconds, and 15 seconds respectively and that the first preset duration is 5 seconds, a response signal that lasts for 5 seconds needs to be extracted from 10 seconds, 12 seconds, and 15 seconds, respectively. In addition, it is best that the time period from which the first preset duration is extracted each time is the same. To be specific, if the time period corresponding to the first preset duration is set to $3^{rd}$-$8^{th}$ seconds within the time period of maintaining the changed charge current, then the time point on each time of changing the charge current needs to serve as a relative "$0^{th}$ second" position, and the first voltage value, the second voltage value, and the voltage variation value in the time period of the relative "$3^{rd}$-$8^{th}$ seconds" are obtained. To be specific, the time points T1A, T3A, and T5A serve as the relative "$0^{th}$ second" position. If the time point T1A is the $20^{th}$ second, the time point T3A is the $50^{th}$ second, and the time point T5A is the $100^{th}$ second, then the first voltage variation value is obtained within the $23^{rd}$-$28^{th}$ seconds, the second voltage variation value is obtained within the $53^{rd}$-$58^{th}$ seconds, and the third voltage variation value is obtained within the $103^{rd}$-$108^{th}$ seconds.

Understandably, the foregoing is a specific implementation process of obtaining a plurality of voltage variation values when the response signal is a voltage signal. If the response signal is a resistance signal, a plurality of resistance variation values can be obtained in the same way, details of which are easily understandable to a person skilled in the art and are omitted here.

503: Determining, based on the voltage variation value, whether the lithium battery is abnormal.

Still using an example in which the response signal is the voltage signal, after the voltage variation value is obtained, whether the lithium battery is abnormal may be directly determined based on the voltage variation value; or, the corresponding resistance variation value can be obtained based on the voltage variation value, and whether the lithium battery is abnormal is determined based on the resistance variation value.

Figure 7:
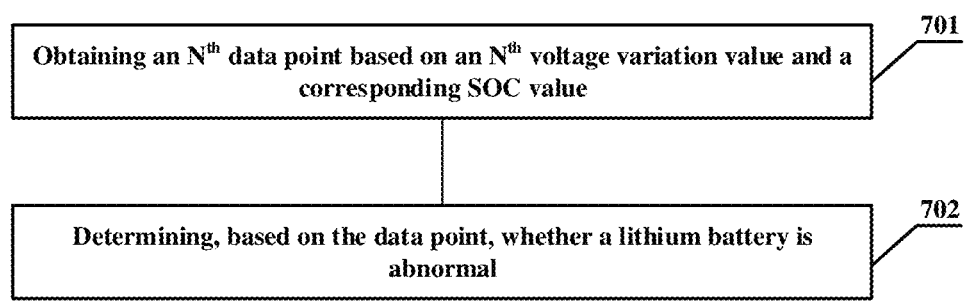
FIG. 7 is a schematic diagram of a method for determining abnormality of a lithium battery based on a voltage variation value according to an embodiment of this application.

In an embodiment, whether the lithium battery is abnormal may be determined directly based on the voltage variation value. As shown in FIG. 7, the implementation process is as follows:

701: Obtaining an $N^{th}$ data point based on an $N^{th}$ voltage variation value and a corresponding SOC value.

702: Determining, based on the data point, whether a lithium battery is abnormal.

Still using FIG. 3a as an example, as shown in FIG. 3a, it can be seen from the foregoing description that the value of the charge current is changed to I2A at the time points T1A, T3A, T5A, and so on corresponding to the SOC values 1A %, 2A %, 3A %, and so on, respectively. Therefore, voltage signals can be obtained in the time periods (T1A, T2A), (T3A, T4A), (T5A, T6A), and so on, respectively, so that a total of N voltage signals are obtained. In addition, the first voltage value and the second voltage value in each voltage signal are extracted in the first preset duration in the foregoing time periods, so as to obtain the voltage variation value in the time periods (T1A, T2A), (T3A, T4A), (T5A, T6A), and so on, respectively. The voltage variation value is recorded as a first voltage variation value $\Delta U1$, a second voltage variation value $\Delta U2$, a third voltage variation value $\Delta U3$, and so on, and an $N^{th}$ voltage variation value $\Delta UN$, respectively.

Therefore, in an embodiment, each voltage variation value and the corresponding SOC value may be used as a data point. The SOC value may be a SOC value prior to changing each charge current. For example, the SOC value corresponding to the first voltage variation value $\Delta U1$ is 1A %, the SOC value corresponding to the second voltage variation value $\Delta U2$ is 2A %, the SOC value corresponding to the third voltage variation value $\Delta U3$ is 3A %, and so on, thereby obtaining data points such as (1A %, $\Delta U1$), (2A %, $\Delta U2$), (3A %, $\Delta U3$), and so on. Whether the lithium battery is abnormal can be determined based on the data points.

Obviously, because the length of the time period of maintaining the charge current changed each time is relatively short, the change of the SOC value in the time period is relatively small. Therefore, any SOC value within the time period of maintaining the charge current changed each time may be selected as the SOC value corresponding to each voltage variation value. For example, assuming that the SOC values corresponding to the time points T2A, T4A, and T6A are 1A1%, 2A1%, 3A1% respectively, the SOC value corresponding to the first voltage variation value $\Delta U1$ may be an arbitrary value selected in (1A %, 1A1%), the SOC value corresponding to the second voltage variation value $\Delta U2$ is an arbitrary value in (2A %, 2A1%), the SOC value corresponding to the third voltage variation value $\Delta U3$ is an arbitrary value in (3A %, 3A1%), and so on. Similarly, a plurality of data points can be obtained, and whether the lithium battery is abnormal can be determined based on the data points.

Figure 8:
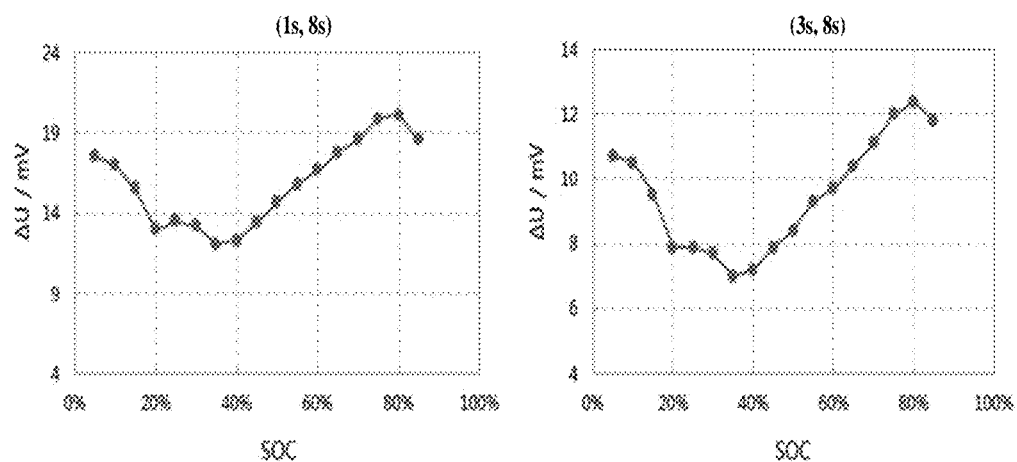
FIG. 8 is a schematic diagram of data points obtained when different first preset durations are set according to an embodiment of this application.

Understandably, depending on the first preset duration that is set variously, the obtained data point is different. For example, in an embodiment, the first preset duration is set to a length of the time period (1s, 8s), and the first preset duration is set to a length of the time period (3s, 8s) separately, so that curves formed by a plurality of data points are obtained respectively, as shown in FIG. 8. Whether the lithium battery is abnormal may be determined based on the plurality of data points of the two curves.

Further, in another embodiment, after a plurality of data points are obtained, whether the lithium battery is abnormal may be determined based on a slope of adjacent data points. A specific implementation process is: obtaining an $N^{th}$ slope between an $(N+1)^{th}$ data point and the $N^{th}$ data point, and an $(N+1)^{th}$ slope between an $(N+2)^{th}$ data point and the $(N+1)^{th}$ data point. If the $N^{th}$ slope is greater than 0 and the $(N+1)^{th}$ slope is less than 0, it is determined that the lithium battery is abnormal.

Figure 9A:
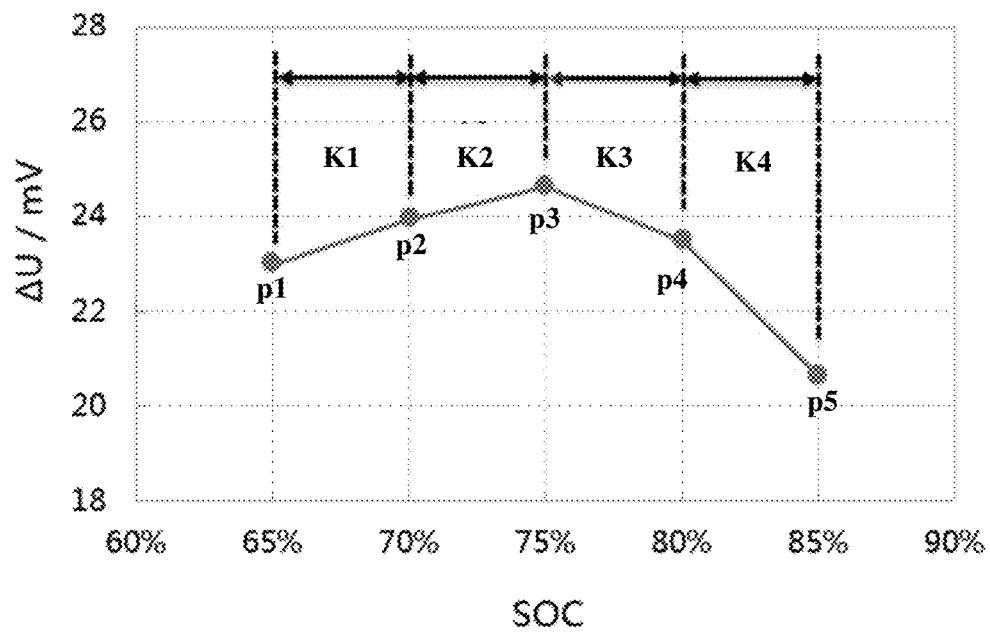
FIG. 9a is a schematic diagram of obtained data points according to an embodiment of this application.

As shown in FIG. 9a, it is assumed that, after the charge current is changed at time points corresponding to the SOC values 65%, 70%, 75%, 80%, and 85% respectively, 5 data points obtained are p1 (65%, 23), p2 (70%, 24), p3 (75%, 25), p4 (80%, 23), and p5 (85%, 21). A slope between p2 and p1 is K1 (K1=(24−23)/(70%−60%)). A slope between p3 and p2 is K2. A slope between p4 and p3 is K3. A slope between p5 and p4 is K4. Subsequently, the two adjacent slopes are checked. If the former slope in the two adjacent slopes is greater than 0 and the latter slope is less than 0, it is determined that abnormality has occurred so far. For example, in FIG. 9a, K1 and K2 are adjacent slopes but both K1 and K2 are greater than 0. Therefore, no abnormality has occurred so far. Further, adjacent slopes K2 and K3 are obtained. At this time, the slope K2 is greater than 0 and the slope K3 is less than 0. Therefore, it is determined that the lithium battery is abnormal, and it is considered that the lithium battery will exhibit an abnormal phenomenon when the lithium battery is charged to a SOC value of approximately 75%.

It needs to be noted that in the embodiment shown in FIG. 9a, a difference between the SOC values corresponding to every two data points is the same, and is 5% uniformly. In other embodiments, the difference between the SOC values corresponding to every two data points may be different.

Figure 9B:
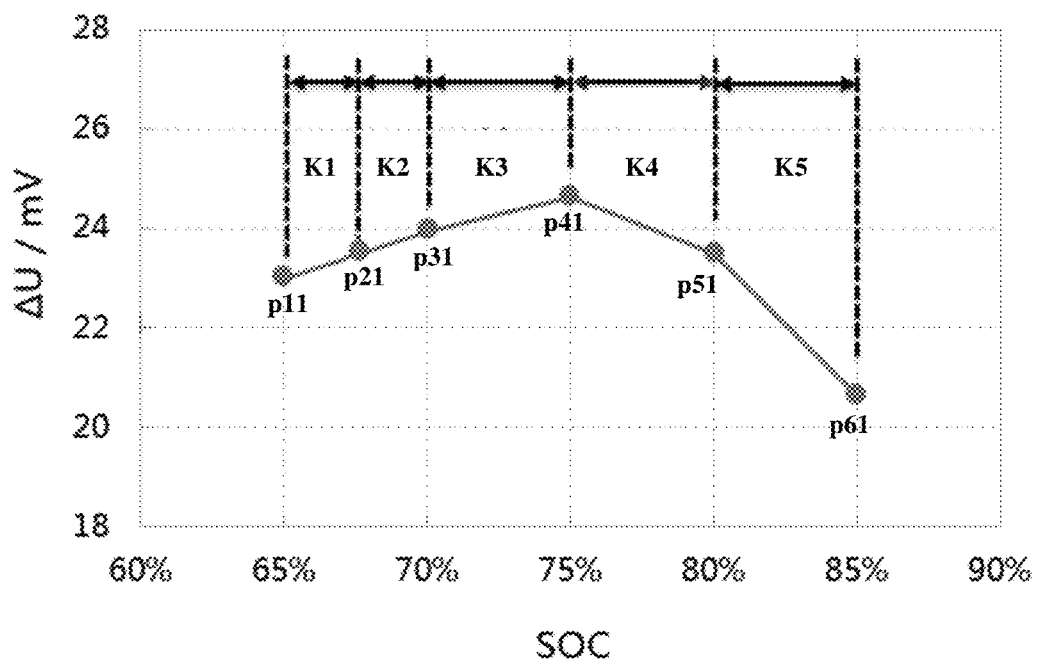
FIG. 9b is a schematic diagram of obtained data points according to another embodiment of this application.

As shown in FIG. 9b, in this embodiment, after the charge current is changed at time points corresponding to the SOC values 65%, 68%, 70%, 75%, 80%, and 85% respectively, 6 data points obtained are p11, p21, p31, p41, p51, and p61, respectively. A difference between the SOC values corresponding to the data point p31 and the data point p21 respectively is 2%, and a difference between the SOC values corresponding to the data point p41 and the data point p31 respectively is 5%. Alternatively, whether the lithium battery is abnormal may be determined based on slopes according to the foregoing solution.

Figure 10:
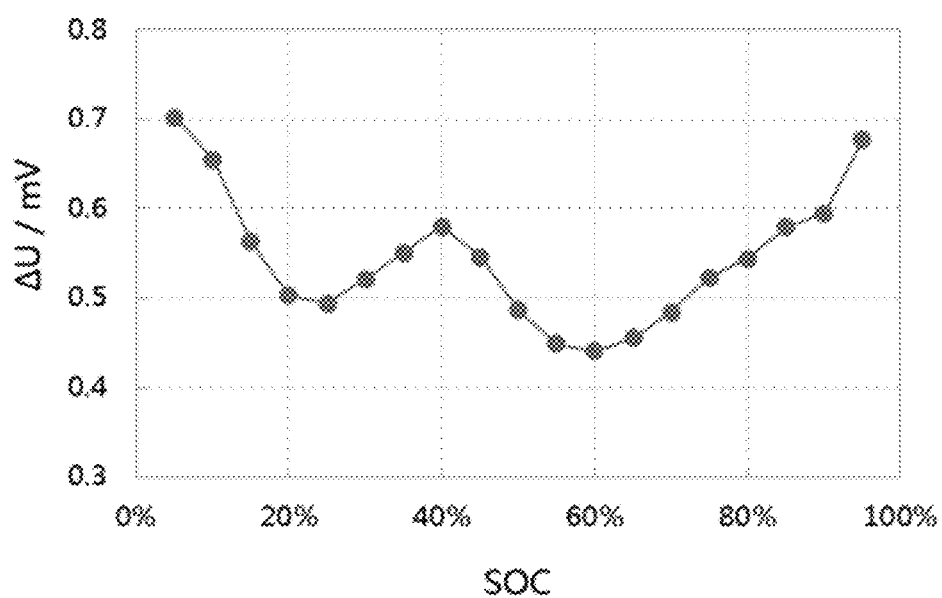
FIG. 10 is a schematic diagram of response signals according to still another embodiment of this application.

In addition, when the SOC value of the battery changes from 0% to 100%, the strength of the response signal does not undergo a process of decreasing first and then increasing with the change of the SOC value, but may undergo a process in which the strength of the response signal (in this case, voltage signal) decreases, then increases, then decreases, and then increases again, as shown in FIG. 10. In this case, the battery is not abnormal. Therefore, to prevent misjudgment and improve accuracy of judgment, whether the battery is abnormal is generally determined when the SOC value is greater than 40%. Optimally, whether the battery is abnormal is determined when the SOC value is greater than 60%.

In another embodiment, the $N^{th}$ resistance variation value may be obtained based on the $N^{th}$ voltage variation value first, and then whether the lithium battery is abnormal is determined based on the obtained resistance variation value. The foregoing process may be implemented in many other ways.

Figure 11:
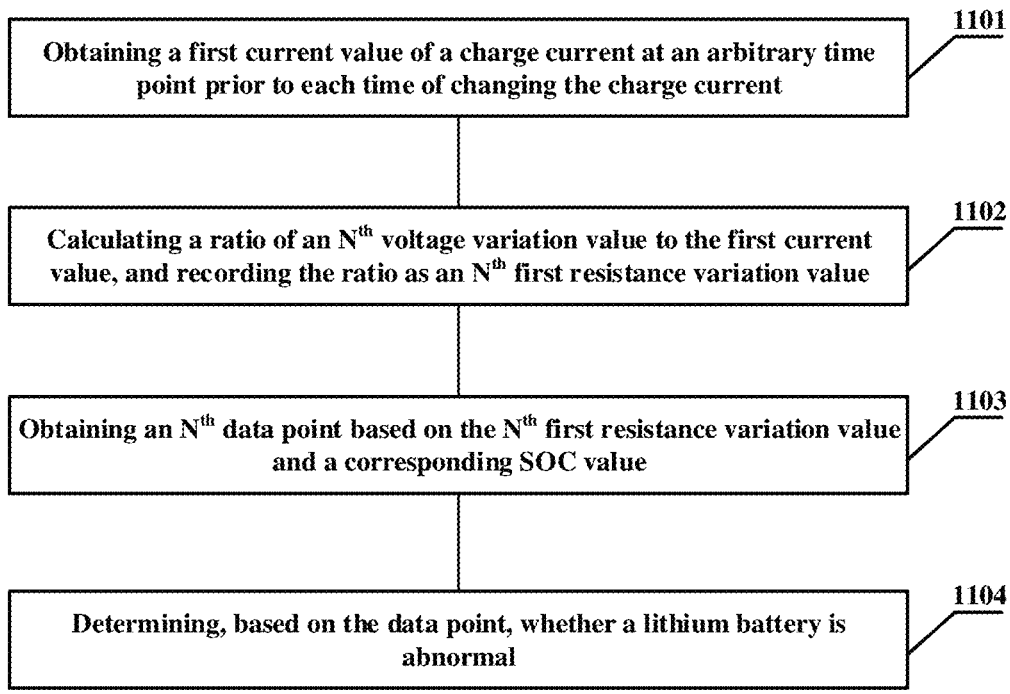
FIG. 11 is a schematic diagram of a method for determining abnormality of a lithium battery based on a first resistance variation value according to an embodiment of this application.

Optionally, as shown in FIG. 11, FIG. 11 shows a possible implementation process of a method for determining, based on a resistance variation value, whether a lithium battery is abnormal. The method includes the following steps:

1101: Obtaining a first current value of a charge current at an arbitrary time point prior to each time of changing the charge current;

1102: Calculating a ratio of an $N^{th}$ voltage variation value to the first current value, and recording the ratio as an $N^{th}$ first resistance variation value;

1103: Obtaining an $N^{th}$ data point based on the $N^{th}$ first resistance variation value and a corresponding SOC value; and

1104: Determining, based on the data point, whether the lithium battery is abnormal.

In a constant-current charging mode, assuming that the value of the charge current is I11, a first current value of the charge current at any time point prior to each time of changing the charge current is I11. Therefore, each first resistance variation value can be obtained by directly calculating a ratio of each obtained voltage variation value to I11.

In a variable-current charging mode, as can be learned from the foregoing description, when the charge current is changed in a specific constant-current charge sub-process of the variable-current charge process, assuming that the value of the charge current in the constant-current charge sub-process is I21, each first resistance variation value can also be obtained by calculating a ratio of each obtained voltage variation value to I21. After a plurality of first resistance variation values are obtained, the data point can also be obtained based on the $N^{th}$ first resistance variation value and the corresponding SOC value.

Figure 12A:
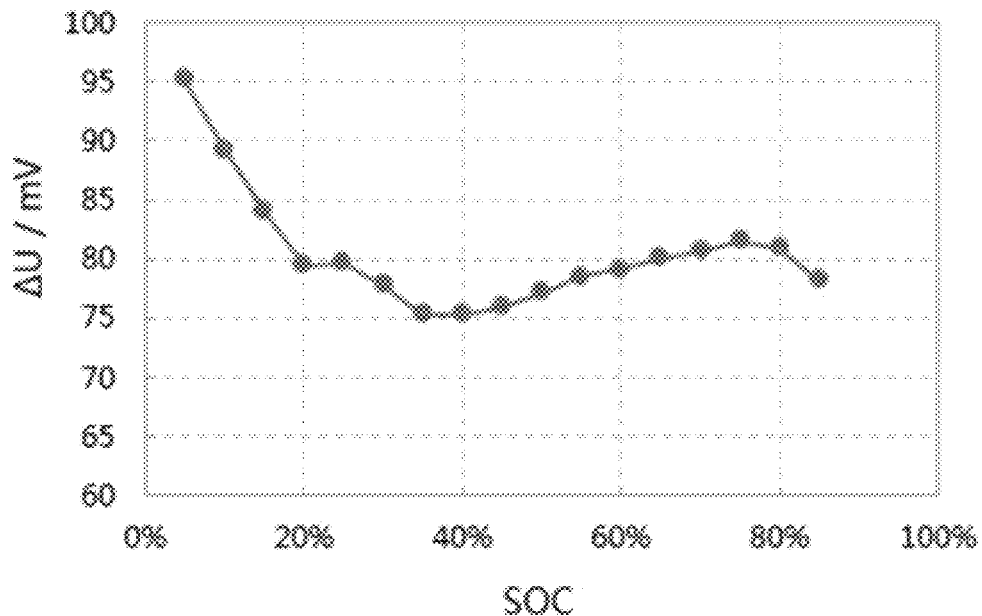
FIG. 12a is a schematic diagram of data points obtained from voltage variation values according to an embodiment of this application.
Figure 12B:
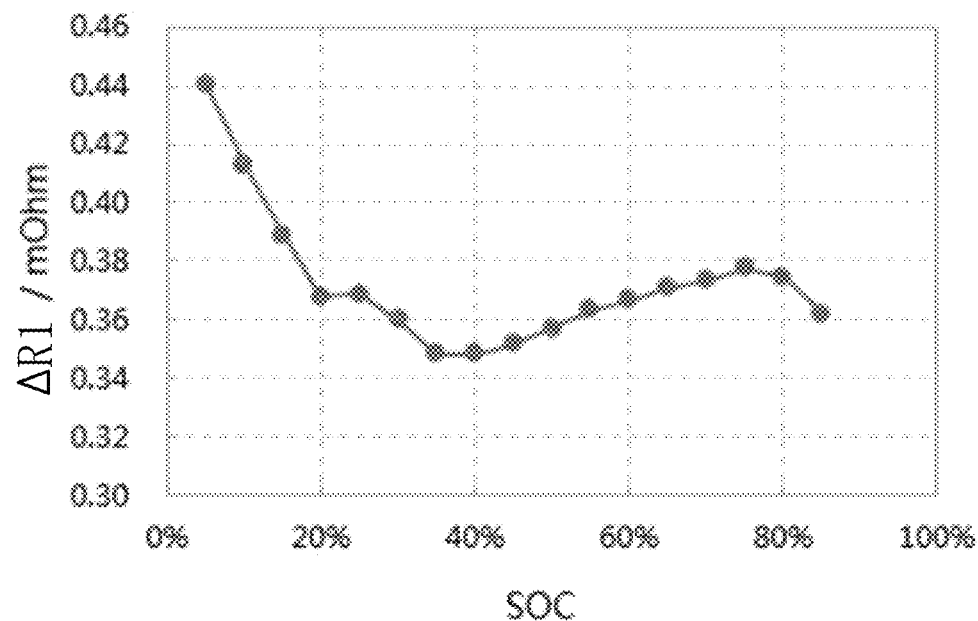
FIG. 12b is a schematic diagram of data points obtained from first resistance variation values according to an embodiment of this application.
Figure 12C:
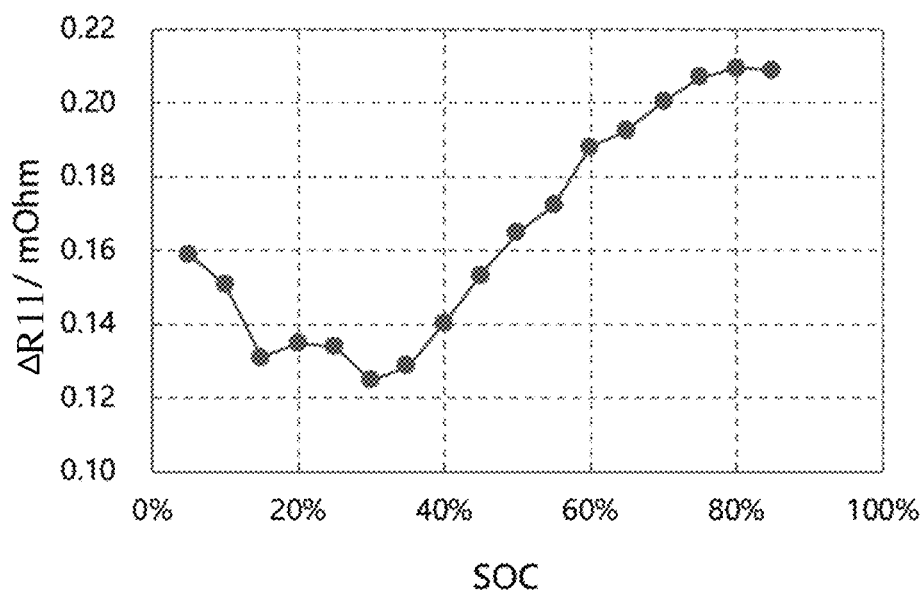
FIG. 12c is a schematic diagram of data points obtained from first resistance variation values according to another embodiment of this application.

Assuming that the data points obtained from the voltage variation value are shown in FIG. 12a, the data points obtained from the first resistance variation value (ΔR1) in the constant-current charging mode are shown in FIG. 12b, and the data points obtained from the first resistance variation value (ΔR11) in the variable-current charging mode are shown in FIG. 12c. Evidently, after the data points are obtained from the first resistance variation value, the $N^{th}$ slope and the $(N+1)^{th}$ slope can also be obtained based on the data points. If the $N^{th}$ slope is greater than 0 and the $(N+1)^{th}$ slope is less than 0, it is determined that the lithium battery is abnormal. The foregoing process is similar to the process of obtaining data points based on the voltage variation value and the corresponding SOC value and determining, based on the data points, whether the lithium battery is abnormal, details of which are easily understandable to a person skilled in the art and are omitted here.

Figure 13:
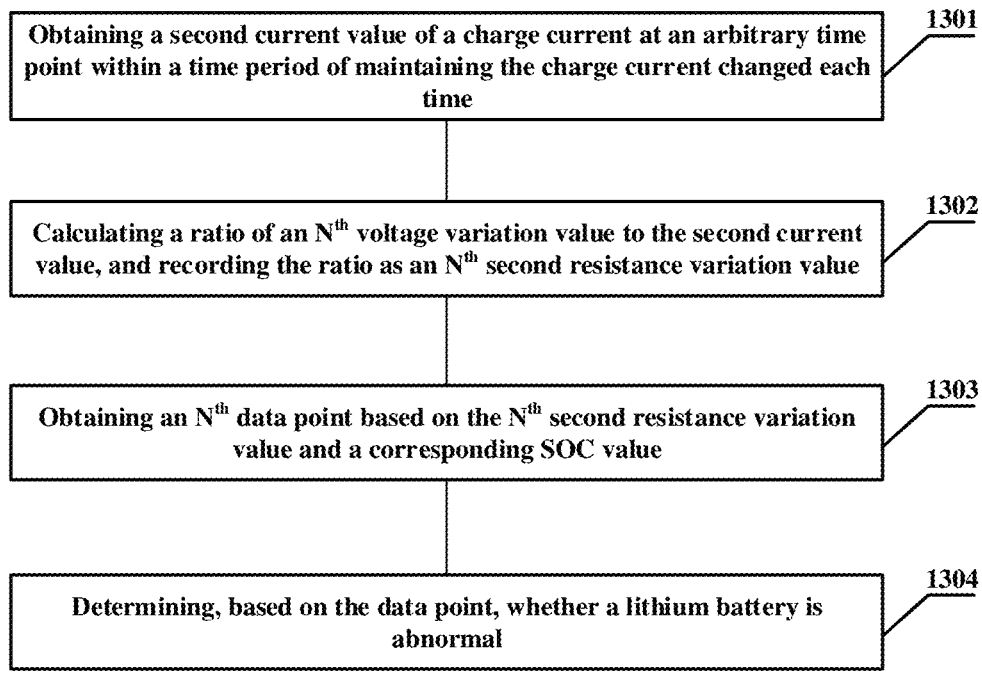
FIG. 13 is a schematic diagram of a method for determining abnormality of a lithium battery based on a second resistance variation value according to an embodiment of this application.

Optionally, as shown in FIG. 13, FIG. 13 shows another possible implementation process of a method for determining, based on a resistance variation value, whether a lithium battery is abnormal. The method includes the following steps:

1301: Obtaining a second current value of a charge current at an arbitrary time point within a time period of maintaining the charge current changed each time;

1302: Calculating a ratio of an $N^{th}$ voltage variation value to the second current value, and recording the ratio as an $N^{th}$ second resistance variation value;

1303: Obtaining an $N^{th}$ data point based on the $N^{th}$ second resistance variation value and a corresponding SOC value; and

1304: Determining, based on the data point, whether the lithium battery is abnormal.

Figure 14:
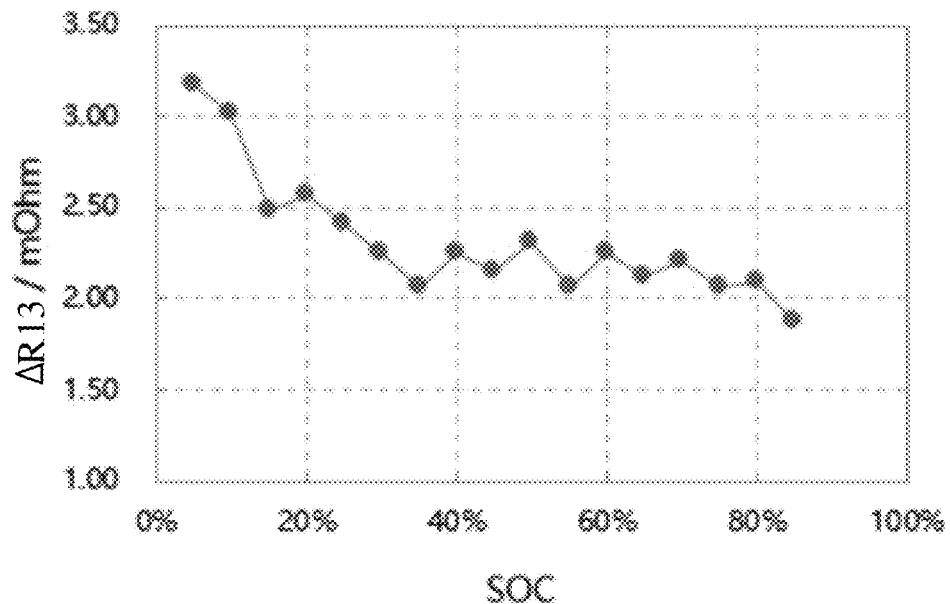
FIG. 14 is a schematic diagram of data points obtained from second resistance variation values according to an embodiment of this application.

In this way, no matter whether the charging mode is a constant-current charging mode or a variable-current charging mode, the obtained value is the second current value I13 of the charge current at an arbitrary time point within the time period of maintaining the charge current changed each time. Each second resistance variation value can be obtained by calculating the ratio of each voltage variation value to I13. In the variable-current charging mode, the data point obtained from the second resistance variation value ($\Delta R13$) is shown in FIG. 14.

Likewise, after the data points are obtained from the second resistance variation value, the $N^{th}$ slope and the $(N+1)^{th}$ slope can be obtained based on the data points. If the $N^{th}$ slope is greater than 0 and the $(N+1)^{th}$ slope is less than 0, it is determined that the lithium battery is abnormal. The foregoing process is similar to the process of obtaining data points based on the voltage variation value and the corresponding SOC value and determining, based on the data points, whether the lithium battery is abnormal, details of which are easily understandable to a person skilled in the art and are omitted here.

Figure 15:
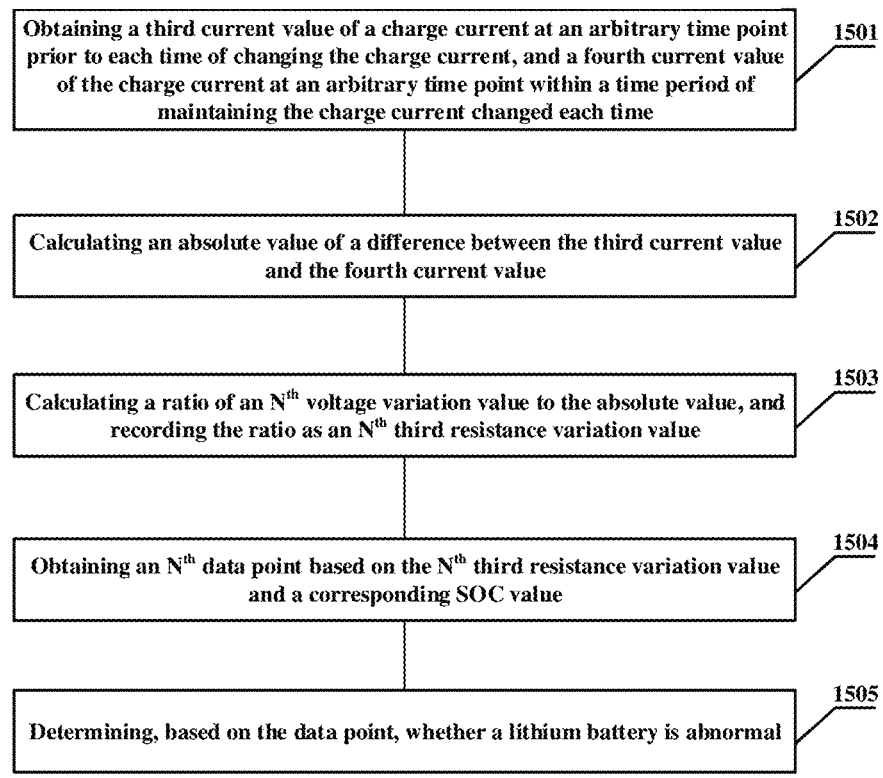
FIG. 15 is a schematic diagram of a method for determining abnormality of a lithium battery based on a third resistance variation value according to an embodiment of this application.

Optionally, as shown in FIG. 15, FIG. 15 shows still another possible implementation process of a method for determining, based on a resistance variation value, whether a lithium battery is abnormal. The method includes the following steps:

1501: Obtaining a third current value of a charge current at an arbitrary time point prior to each time of changing the charge current, and a fourth current value of the charge current at an arbitrary time point within a time period of maintaining the charge current changed each time;

1502: Calculating an absolute value of a difference between the third current value and the fourth current value;

1503: Calculating a ratio of an $N^{th}$ voltage variation value to the absolute value, and recording the ratio as an $N^{th}$ third resistance variation value;

1504: Obtaining an $N^{th}$ data point based on the $N^{th}$ third resistance variation value and a corresponding SOC value; and

1505: Determining, based on the data point, whether the lithium battery is abnormal.

Figure 16:
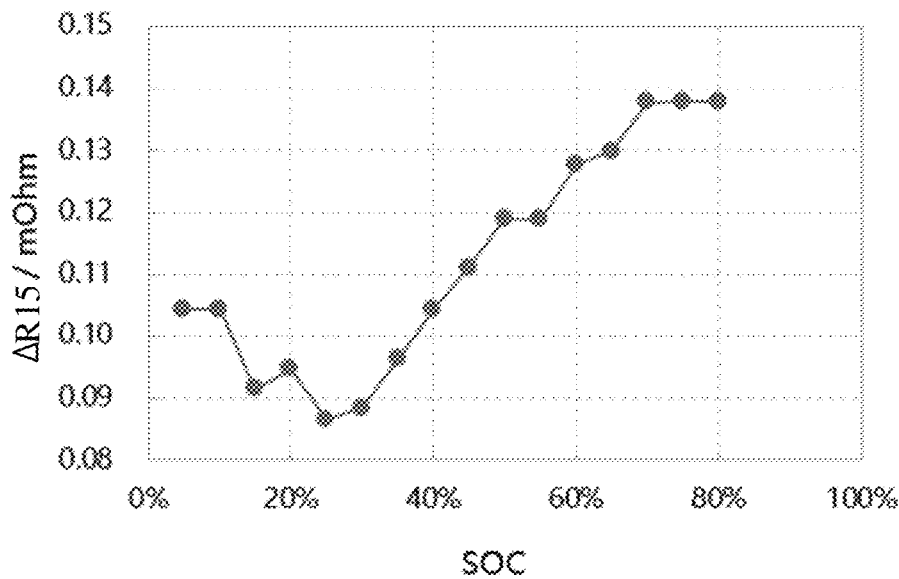
FIG. 16 is a schematic diagram of data points obtained from third resistance variation values according to an embodiment of this application.

The way of obtaining the third current value is the same as the way of obtaining the first current value as shown in FIG. 11, and the way of obtaining the fourth current value is the same as the way of obtaining the second current value as shown in FIG. 13. Subsequently, the absolute value I15 of the difference between the third current value and the fourth current value can be calculated. Each third resistance variation value can be obtained by calculating the ratio of each voltage variation value to I15. In the variable-current charging mode, the data point obtained from the third resistance variation value ($\Delta R15$) is shown in FIG. 16.

Likewise, after the data points are obtained from the third resistance variation value, the $N^{th}$ slope and the $(N+1)^{th}$ slope can be obtained based on the data points. If the $N^{th}$ slope is greater than 0 and the $(N+1)^{th}$ slope is less than 0, it is determined that the lithium battery is abnormal. The foregoing process is similar to the process of obtaining data points based on the voltage variation value and the corresponding SOC value and determining, based on the data points, whether the lithium battery is abnormal, details of which are easily understandable to a person skilled in the art and are omitted here.

Understandably, no matter whether the charging mode is a constant-current charging mode or a variable-current charging mode, the method provided in this embodiment of this application can be used to determine whether a lithium battery is abnormal. However, it needs to be noted that, for the variable-current charging mode, a method of highest detection precision suitable for detecting a small amount of abnormality is the method shown in FIG. 15, and a method of lowest precision is the method shown in FIG. 13.

In conclusion, in a case that the response signal is a voltage signal, after a plurality of voltage variation values are obtained, a plurality of data points can be obtained directly based on the voltage variation values, and then whether the lithium battery is abnormal is determined based on a slope of adjacent data points in the plurality of data points. Alternatively, resistance variation values are obtained from the voltage variation values first, and then a plurality of data points are obtained based on the resistance variation values, and finally, whether the lithium battery is abnormal is determined based on the slope of the adjacent data points in the plurality of data points.

If the response signal is a resistance signal, the resistance signal needs to be obtained based on the voltage signal, and then a resistance variation value is directly obtained from the resistance signal. Subsequently, a plurality of data points can be obtained based on the resistance variation value, and whether the lithium battery is abnormal is determined based on a slope of adjacent data points in the plurality of data points.

Figure 17:
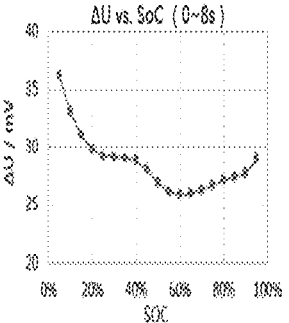
FIG. 17 is a schematic diagram of determining abnormality of a lithium battery at different charge currents of the lithium battery according to an embodiment of this application.

In practical applications, a test on whether a lithium battery is abnormal is carried out when the lithium battery is controlled to be under different charge currents, using a constant-current charging mode as an example. The test may use a 60 Ah commercial lithium-ion battery. A charge rate of constant-current charging is 0.3 C, 0.5 C, and 1.0 C respectively. In each case, when the SOC value of the battery increases by each 5% as a result of charging, the current is changed to 0.1 C and stays for 8 seconds. The obtained data points and determining results are shown in FIG. 17.

When the charge rate of constant-current charging is 0.3 C, if none of the slopes obtained based on adjacent data points meets a condition that the former slope in adjacent slopes is greater than 0 and the latter slope is less than 0, it indicates that the lithium battery is not abnormal. In addition, by disassembling the lithium battery, it can also be concluded that the lithium battery is not abnormal. The conclusion is consistent with the determining result of the determining method provided in this embodiment of this application.

When the charge rate of constant-current charging is 0.5 C, if none of the slopes obtained based on adjacent data points meets a condition that the former slope in adjacent slopes is greater than 0 and the latter slope is less than 0, it indicates that the lithium battery is not abnormal. In addition, by disassembling the lithium battery, it can be concluded that the lithium battery is not abnormal.

When the charge rate of constant-current charging is 1.0 C, if, near a SOC value of 80%, adjacent slopes in the slopes obtained based on adjacent data points meet a condition that the former slope in the adjacent slopes is greater than 0 and the latter slope is less than 0, it indicates that the lithium battery is abnormal. In addition, by disassembling the lithium battery, it is concluded that the lithium battery is abnormal. The conclusion is consistent with the determining result of the determining method provided in this embodiment of this application.

In conclusion, regardless of an initial charge current in the constant-current charging, the value of the charge current can be changed in the charge process to determine whether the lithium battery is abnormal.

In another embodiment, still the constant-current charging mode is used as an example, and the charge rate of the constant-current charging is maintained at 1.2 C. The charge current is reduced to 0 (that is, the battery stands statically), increased (or decreased) by a current of 1.1 C and 1.0 C, separately, to detect whether the lithium battery is abnormal. Still, when the SOC value of the battery increases each 5% as a result of charging, the charge current is changed and stays for 8 seconds. The obtained data points and the determining result are shown in FIG. 18.

Adding a pulse means a process of changing the value of the current, and the process may be approximately regarded as adding a pulse onto the original charge current. For example, adding a static standing duration of 8 seconds is to reduce the current to 0 and stay for 8 seconds. This is equivalent to adding a current pulse of the same value but an opposite direction onto the original charge current, so that the actual charge current is 0 within the 8 seconds. As can be seen from FIG. 18, in all the three circumstances described above, near a SOC value of 80%, adjacent slopes meet the condition that the former slope in the adjacent slopes is greater than 0 and the latter slope is less than 0, indicating that the lithium battery is abnormal. In addition, by disassembling the lithium battery, it is concluded that the lithium battery is abnormal. The conclusion is consistent with the determining result of the determining method provided in this embodiment of this application.

Therefore, the method for detecting abnormality of a lithium battery according this embodiment of this application may be implemented by increasing the charge current of the lithium battery, or by decreasing the charge current of the lithium battery.

In another embodiment, still using the constant-current charging mode as an example, the charge rate is maintained at 1.5 C. When the SOC value of the battery increases by each 5% as a result of charging, the current of the battery increases (or decreases) by 1.4 C and stays for 8 seconds. Different data points can be obtained by selecting different first preset durations. The obtained data points and the determining result are shown in FIG. 19.

The first preset duration is set to 3 seconds, 8 seconds, and 5 seconds, respectively. As can be seen from FIG. 19, in all the three circumstances described above, near a SOC value of 70%, adjacent slopes meet the condition that the former slope in the adjacent slopes is greater than 0 and the latter slope is less than 0, indicating that the lithium battery is abnormal. In addition, by disassembling the lithium battery, it is concluded that the lithium battery is abnormal. The conclusion is consistent with the determining result of the determining method provided in this embodiment of this application.

Therefore, both the first preset duration and a start point thereof may be set according to actual usage conditions of the user, and can be used to determine whether the lithium battery is abnormal.

Figure 20:
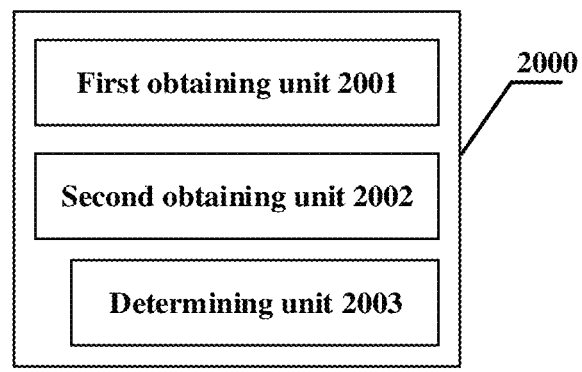
FIG. 20 is a schematic diagram of a device for detecting abnormality of a lithium battery according to an embodiment of this application.

FIG. 20 is a schematic structural diagram of a device for detecting abnormality of a lithium battery according to an embodiment of this application. As shown in FIG. 20, the device 2000 for detecting abnormality of a lithium battery includes a first obtaining unit 2001, a second obtaining unit 2002, and a determining unit 2003. The first obtaining unit 2001 is configured to obtain a SOC value of the lithium battery in a charge process, where the SOC value is a ratio of a remaining capacity of the battery to a nominal capacity of the battery. The second obtaining unit 2002 is configured to change a value of a charge current at a time point corresponding to an arbitrary SOC value, and obtain a response signal within a time period of maintaining the changed charge current. The determining unit 2003 is configured to determine, based on response signals at time points corresponding to a plurality of SOC values, whether the lithium battery is abnormal.

The device embodiment and the method embodiment are based on the same conception. Therefore, the content of the device embodiment can be obtained by referring to the method embodiment as long as the content does not conflict with each other, and the details are omitted here.

Figure 21:
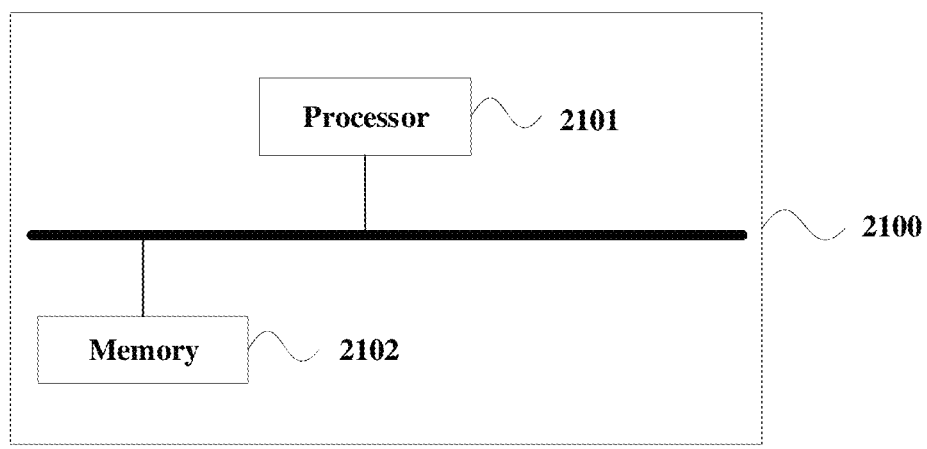
FIG. 21 is a schematic diagram of a device for detecting abnormality of a lithium battery according to another embodiment of this application.

FIG. 21 is a schematic structural diagram of a device for detecting abnormality of a lithium battery according to an embodiment of this application. As shown in FIG. 21, the device 2100 for detecting abnormality of a lithium battery includes one or more processors 2101 and a memory 2102. In FIG. 21, one processor 2101 is used as an example.

The processor 2101 and the memory 2102 may be connected by a bus or by other means. In FIG. 21, connecting by a bus is used as an example.

The memory 2102, serving as a non-volatile computer-readable storage medium, can be used to store non-volatile software programs, and non-volatile computer-executable programs and modules, for example, program instructions/modules (such as the units shown in FIG. 20) corresponding to the method for detecting abnormality of a lithium battery according to this embodiment of this application. By running the non-volatile software programs, instructions, and modules stored in the memory 2102, the processor 2101 performs various functions and data processing of the device for detecting abnormality of a lithium battery, that is, implements the method for detecting abnormality of a lithium battery in the foregoing method embodiment and the functions of various modules and units in the foregoing device embodiment.

The memory 2102 may include a high-speed random access memory, and may further include a non-volatile memory, for example, at least one disk storage device, a flash memory device, or other non-volatile solid-state storage devices. In some embodiments, the memory 2102 optionally includes memories disposed remotely with respect to the processor 2101. The remote memories may be connected to the processor 2101 by a network. Examples of the network include, but are not limited to, the Internet, a corporate intranet, a local area network, a mobile communications network, and any combination thereof.

The program instructions/modules are stored in the memory 2102. When executed by the one or more processors 2101, the program instructions/modules implement the method for detecting abnormality of a lithium battery according to any method embodiment described above, for example, implement the steps described above and shown in FIG. 2, FIG. 5, FIG. 7, FIG. 11, FIG. 13, and FIG. 15; and can further implement the functions of each unit shown in FIG. 20.

An embodiment of this application further provides a battery management system, including the device for detecting abnormality of a lithium battery according to any embodiment described above. The battery management system may be installed in a vehicle or the like to manage a battery.

An embodiment of this application further provides a battery system, including a rechargeable battery and the battery management system according to any embodiment described above. The battery management system is configured to manage the battery.

An embodiment of this application further provides an electric vehicle, including a charging and discharging device and the battery system according to any embodiment described above. The charging and discharging device is configured to charge a battery. A battery management system in the battery system can control a value of a charge current that is used by the charging and discharging device to charge the battery.

An embodiment of this application further provides a non-volatile computer storage medium. The computer storage medium stores a computer-executable instruction. The computer-executable instruction is executed by one or more processors, for example, one processor 2101 shown in FIG. 21. In this way, the one or more processors can implement the method for detecting abnormality of a lithium battery according to any method embodiment described above, for example, implement the steps described above and shown in FIG. 2, FIG. 5, FIG. 7, FIG. 11, FIG. 13, and FIG. 15; and can further implement the functions of each unit shown in FIG. 20.

The apparatus or device embodiments described above are merely exemplary. The units or modules described as discrete parts may be physically separate or not, and the parts displayed as units or modules may be physical units or not, and may be located in one position or distributed on a plurality of network modules or units. A part of or all of the modules may be selected according to the actual needs to achieve the objectives of the solutions of the embodiments.

According to the embodiments described above, a person skilled in the art clearly understands that all the embodiments may be implemented by using software in combination with a universal hardware platform, or by using hardware. Based on such an understanding, the foregoing technical solutions essentially or the part contributing to the related art may be implemented in a form of a software product. The computer software product may be stored in a computer-readable storage medium such as a ROM/RAM, a magnetic disk, or an optical disc, and may include several instructions that cause a computer device (which may be a personal computer, a server, a network device, or the like) to perform the methods described in the foregoing embodiments or in some parts of the embodiments.

Although this application has been described with reference to exemplary embodiments, various improvements may be made to the embodiments without departing from the scope of this application, and the parts therein may be replaced with equivalents. Particularly, to the extent that no structural conflict exists, various technical features mentioned in various embodiments can be combined in any manner. This application is not limited to the specific embodiments disclosed herein, but includes all technical solutions falling within the scope of the claims.

What is claimed is:

1. A method for detecting abnormality of a lithium battery, comprising:
    obtaining a state of charge (SOC) value of the lithium battery in a charge process, wherein the SOC value is a ratio of a remaining capacity of the battery to a nominal capacity of the battery;
    changing a value of a charge current at a time point corresponding to an arbitrary SOC value, and obtaining a response signal within a time period of maintaining the changed charge current; and
    determining, based on response signals at time points corresponding to a plurality of SOC values, whether the lithium battery is abnormal;
    wherein the response signal is a voltage signal;
    the determining, based on response signals at time points corresponding to a plurality of SOC values, whether the lithium battery (102) is abnormal comprises:
    obtaining a first voltage value in an $N^{th}$ voltage signal at a start time point of a first preset duration, and obtaining a second voltage value in the $N^{th}$ voltage signal at an end time point of the first preset duration, wherein the first preset duration is an arbitrary time period within the time period of maintaining the charge current changed each time;
    obtaining an $N^{th}$ voltage variation value based on an absolute value of a difference between the first voltage value and the second voltage value in the $N^{th}$ voltage signal; and
    determining, based on the voltage variation value, whether the lithium battery (102) is abnormal.

2. The method according to claim 1, wherein the changing a value of a charge current at a time point corresponding to an arbitrary SOC value comprises:
    outputting a change-current instruction at the time point corresponding to the arbitrary SOC value, so as to change the value of the charge current, wherein the change-current instruction comprises an instruction to change the value of the charge current and an instruction indicating the time period of maintaining the changed charge current.

3. The method according to claim 1, wherein the changing a value of a charge current at a time point corresponding to an arbitrary SOC value comprises:
    changing the value of the charge current at time points corresponding to at least three SOC values.

4. The method according to claim 1, wherein the determining, based on the voltage variation value, whether the lithium battery is abnormal comprises:
    obtaining an $N^{th}$ data point based on the $N^{th}$ voltage variation value and a corresponding SOC value; and
    determining, based on the data point, whether the lithium battery is abnormal.

5. The method according to claim 1, wherein the determining, based on the voltage variation value, whether the lithium battery is abnormal comprises:
    obtaining a first current value of the charge current at an arbitrary time point prior to each time of changing the charge current;
    calculating a ratio of the $N^{th}$ voltage variation value to the first current value, and recording the ratio as an $N^{th}$ first resistance variation value;
    obtaining an $N^{th}$ data point based on the $N^{th}$ first resistance variation value and a corresponding SOC value; and
    determining, based on the data point, whether the lithium battery is abnormal.

6. The method according to claim 1, wherein the determining, based on the voltage variation value, whether the lithium battery is abnormal comprises:
    obtaining a second current value of the charge current at an arbitrary time point within the time period of maintaining the charge current changed each time;
    calculating a ratio of the $N^{th}$ voltage variation value to the second current value, and recording the ratio as an $N^{th}$ second resistance variation value; and
    obtaining an $N^{th}$ data point based on the $N^{th}$ second resistance variation value and a corresponding SOC value; and
    determining, based on the data point, whether the lithium battery is abnormal.

7. The method according to claim 1, wherein the determining, based on the voltage variation value, whether the lithium battery is abnormal comprises:
obtaining a third current value of the charge current at an arbitrary time point prior to each time of changing the charge current, and a fourth current value of the charge current at an arbitrary time point within the time period of maintaining the charge current changed each time;
calculating an absolute value of a difference between the third current value and the fourth current value; and
calculating a ratio of the $N^{th}$ voltage variation value to the absolute value, and recording the ratio as an $N^{th}$ third resistance variation value; and
obtaining an $N^{th}$ data point based on the $N^{th}$ third resistance variation value and a corresponding SOC value; and
determining, based on the data point, whether the lithium battery is abnormal.

8. The method according to claim 4, wherein the determining, based on the data point, whether the lithium battery is abnormal comprises:
obtaining an $N^{th}$ slope between an $(N+1)^{th}$ data point and the $N^{th}$ data point, and an $(N+1)^{th}$ slope between an $(N+2)^{th}$ data point and the $(N+1)^{th}$ data point; and
determining, if the $N^{th}$ slope is greater than 0 and the $(N+1)^{th}$ slope is less than 0, that the lithium battery is abnormal.

9. A device for detecting abnormality of a lithium battery, comprising:
a processor, configured to obtain a state of charge (SOC) value of the lithium battery in a charge process, wherein the SOC value is a ratio of a remaining capacity of the battery to a nominal capacity of the battery;
change a value of a charge current at a time point corresponding to an arbitrary SOC value, and obtain a response signal within a time period of maintaining the changed charge current; and
determine, based on response signals at time points corresponding to a plurality of SOC values, whether the lithium battery is abnormal;
wherein the response signal is a voltage signal;
the determining, based on response signals at time points corresponding to a plurality of SOC values, whether the lithium battery (102) is abnormal comprises:
obtaining a first voltage value in an $N^{th}$ voltage signal at a start time point of a first preset duration, and obtaining a second voltage value in the $N^{th}$ voltage signal at an end time point of the first preset duration, wherein the first preset duration is an arbitrary time period within the time period of maintaining the charge current changed each time;
obtaining an $N^{th}$ voltage variation value based on an absolute value of a difference between the first voltage value and the second voltage value in the $N^{th}$ voltage signal; and
determining, based on the voltage variation value, whether the lithium battery (102) is abnormal.

10. A battery management system, comprising the device for detecting abnormality of a lithium battery according to claim 9.

11. A battery system, comprising a rechargeable battery and the battery management system according to claim 10.

12. An electric vehicle, comprising a charging and discharging device and the battery system according to claim 11.

* * * * *